United States Patent [19]

Balaban

[11] 3,796,963

[45] Mar. 12, 1974

[54] SIGNAL LIMITER FOR EXALTED CARRIER AM DETECTOR

[75] Inventor: Alvin Reuben Balaban, Raritan, N.J.

[73] Assignee: RCA Corporation, New York, N.Y.

[22] Filed: Nov. 6, 1972

[21] Appl. No.: 303,796

[52] U.S. Cl. .................. 329/101, 328/171, 329/134, 329/204, 330/30 D

[51] Int. Cl. ........ H03d 1/04, H03d 1/10, H03d 1/18

[58] Field of Search ...... 329/204, 205, 50, 131–134, 329/101; 330/30 D; 307/235; 328/171

[56] References Cited

UNITED STATES PATENTS

| | | | |
|---|---|---|---|
| 3,395,359 | 7/1968 | Zachev | 330/30 D |
| 3,434,075 | 3/1969 | Hawkins | 329/50 X |
| 3,584,231 | 6/1971 | Dorward | 307/291 X |

*Primary Examiner*—James W. Lawrence
*Assistant Examiner*—Marvin Nussbaum
*Attorney, Agent, or Firm*—Eugene M. Whitacre

[57] ABSTRACT

A signal limiter operable at video i-f frequency with substantially less AM to PM conversion than prior art signal limiters includes a pair of diodes in inverse parallel combination (with the anode of one diode connected to the anode of the other) between the emitter electrodes of first and second common-collector transistors. Anti-phase i-f signals are applied respectively to the first transistor and second transistor base electrodes. The transistors alternately function as emitter followers to provide a low impedance (of the order of diode forward-impedance) drive to the diode combination to maintain limiter frequency response despite stray capacitances. While one of the transistors functions as an emitter follower, the other has its base-emitter junction reverse-biased, permitting the quiescent current demands of the limiter to be lower than where emitter-follower action is constantly maintained in both transistor circuits. The signal limiter output signal is extracted by differential amplifier means having inverting and non-inverting input terminals connected at respective ends of the diode combination. The differential amplifier may be arranged to be a product detector in an exalted carrier video detector.

8 Claims, 4 Drawing Figures

SIGNAL LIMITER FOR EXALTED CARRIER AM DETECTOR

The present invention relates to signal limiters and more particularly to signal limiters for use in the exalted carrier video detectors of television receivers.

Signal limiters including a pair of diodes connected in inverse parallel combination—i.e., with the anode of each connected to the cathode of the other—are known in the prior art. The limiter diodes each have stray capacitance to ground. These stray capacitances tend undesirably to limit the frequency response of the signal limiter. Designing the signal limiter to have very low impedance level will reduce the effects of the stray capacitances upon limiter frequency response, but leads to undesirably high power dissipation from the signal limiter and from the circuitry supplying it with signals to be limited.

A conventional solution to the problem of stray diode capacitances in a signal limiter to be used in the 45 MHz region is to connect other reactive elements with the limiter diodes so that they are in anti-resonant combination with the stray capacitances. This solution has proven unsatisfactory because the variation of the junction capacitance as a function of instantaneous signal amplitude detunes the anti-resonant combination and causes the conversion of amplitude modulation of the signals being limited to phase modulation. Such AM to PM conversion is undesirable since the resultant phase modulation can be detected by the subsequent detector which employs the limited signal.

A signal limiter which embodies the present invention utilizes a source of first and second input signals anti-phased with respect to each other. First and second transistors each having a semi-conductor junction between their base and emitter electrodes are connected in common-collector configuration, their base electrodes being connected to the source and respectively receiving the anti-phase first and second input signals therefrom. A differential amplifier has first and second input terminals respectively connected to separate ones of the first and second transistor emitter electrodes. The differential amplifier output circuit provides differential response to the signals applied to its input terminals, between which first and second diodes are connected in inverse parallel or back-to-back relationship with each other. Emitter currents are applied to each of the first and second transistor emitter electrodes to maintain forward conduction through their respective base-emitter semi-conductor junctions during a portion of the cycle of the first and second input signals, when these signals are large enough that signals appearing between the input terminals of the differential amplifier are limited.

The present invention will be better understood from the following text and the accompanying drawing in which.

Figure 1:
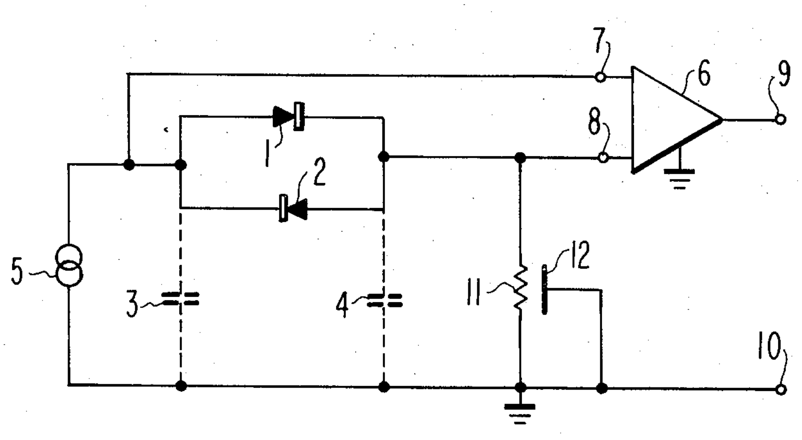
FIG. 1 is a schematic diagram of a limiter circuit useful for explaining principles of the present invention.

Referring to FIG. 1 a signal limiter using a pair of diodes 1, 2 in inverse-parallel connection is shown. The diodes 1, 2 have stray capacitances 3, 4 to an equipotential surface at ground reference potential. The stray capacitance 3, 4 might be the anode-to-substrate capacitances of diodes 1, 2 were these diodes made in integrated circuit form, for instance.

The source of input signals 5 is of a type having a low source impedance as compared to that of the stray capacitance 3 for the frequency range of the input signals. This low source impedance shunts the capacitance 3 throughout this frequency range so that there is no appreciable attenuation of the input signal potentials which might otherwise be caused by low-pass RC filter action.

On positive swings of input signal potential from the source 5 which exceed its threshold of conduction potential, the diode 1 is forward biased, limiting the signal excursion across itself substantially to that threshold of conduction potential. On negative swings of input signal potential from the source 5 which exceed its threshold of conduction potential, the diode 2 is forward biased, limiting the signal excursion across itself substantially to that threshold of conduction potential. The differential amplifier 6 is presented with a symmetrically limited input signal as between its input terminals 7 and 8, one of which is an inverting input terminal and the other of which is a non-inverting input terminal. A symmetrically limited output signal appears at the output terminal 9 of the differential amplifier 6 and is referred to ground reference potential at terminal 10.

The resistor 11 has a resistance chosen to be substantially greater than the source impedance of source 5—typically at least an order of magnitude greater—to maintain the current demands upon the source 5 within acceptably low limits, particularly for input signal potential swings substantially larger than the threshold potentials beyond which the diode 1 or 2 will be biased into forward conduction. This current limitation keeps the power dissipation from the signal limiter within acceptable bounds. Despite the resistance of resistor 11 being comparatively large, its capacitance 12 to ground reference potential and the stray capacitance 4 do not impair signal limiter frequency response, but rather act to improve it. This is because they provide in series relationship with the inverse-parallel combination of diodes 1, 2 a high frequency path of lower impedance than that of resistor 11 alone.

The arrangement of component elements shown in FIG. 1 so locates the stray capacitances 3, 4 that they do not appreciably reduce the frequency response or band-width of the signal limiter.

Figures 2, 4:
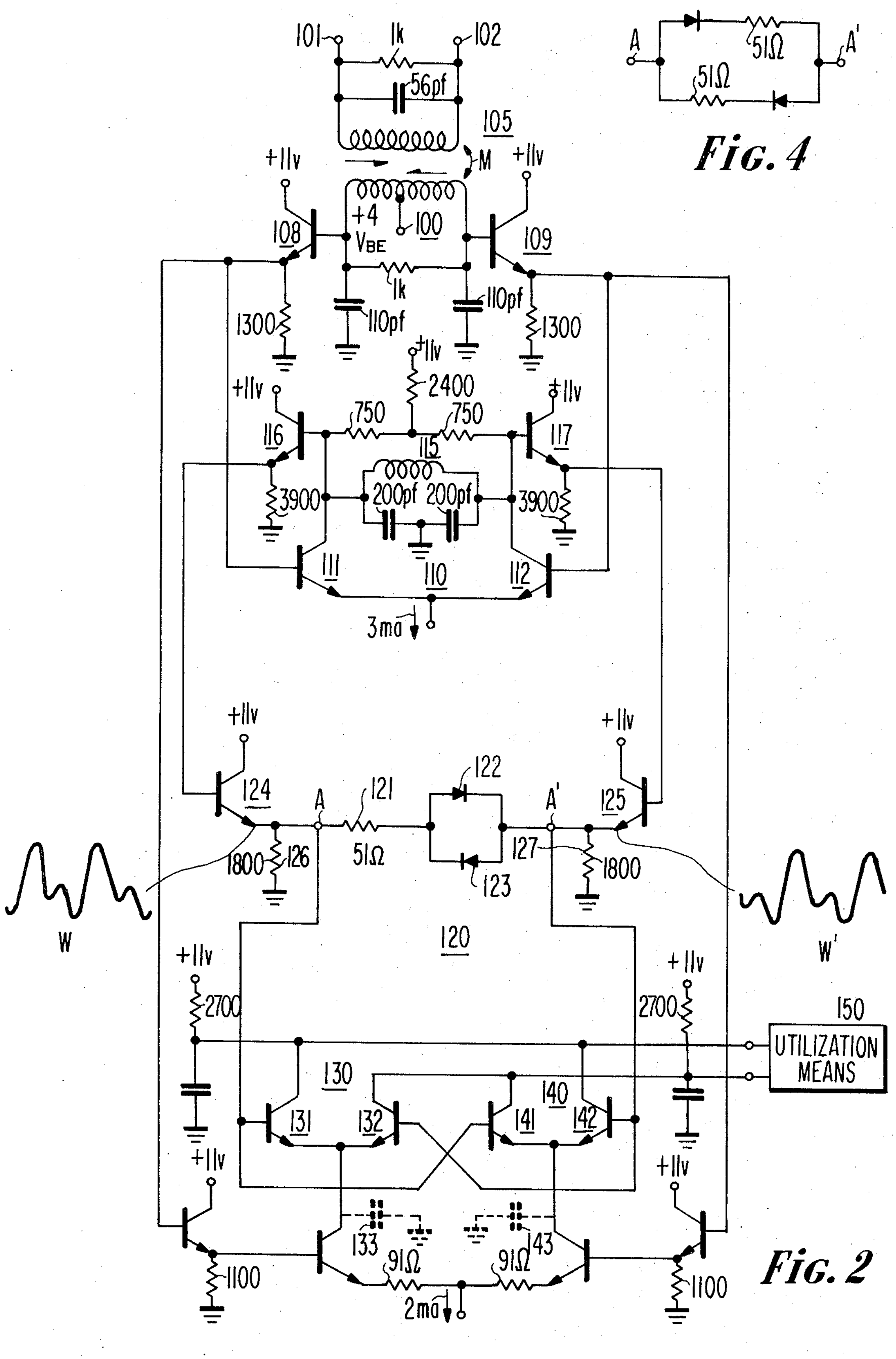
FIG. 2 is a schematic diagram of an embodiment of the present invention used in an exalted carrier AM detector.
FIG. 4 is a schematic diagram of an alternative structure for a portion of the embodiment of FIG. 2.

FIG. 2 shows in schematic circuit diagram an exalted carrier video detector. Video intermediate-frequency modulated carrier waves as may be supplied from the video intermediate-frequency amplifier of a television receiver are passed through a tuned-input-circuit buffer amplifier 100. A tuned-output-circuit amplifier 110 responds to signals supplied from the buffer amplifier 100 to provide filtered modulated carrier waves to a signal limiter 120. The signal limiter 120, which is an embodiment of the present invention, is responsive to the signals thereto applied to supply substantially unmodulated video intermediate-frequency carrier wave between its terminals A, A′. This unmodulated carrier wave, and modulated carrier wave from the buffer amplifier 100 are applied as separate input signals to a first product detector 130 wherein the modulated carrier wave is synchronously detected to provide detected video signals to utilization means 150. The unmodulated carrier wave from the signal limiter 120 and modulated carrier wave from the buffer amplifier 100 are applied as separate input signals to a second product detector 140 wherein the modulated carrier wave is synchronously detected to provide detected video signals to augment those provided by the product detector 130 to the utilization means 150.

More specifically, video i-f modulated carrier wave signals applied to input terminals 101, 102 of the buffer amplifier 100 are coupled via a double-tuned transformer 105, to respective base electrodes of common-collector amplifier transistors 108 and 109. Transistors 108, 109 exhibit emitter-follower action providing anti-phase modulated carrier wave signals at low impedance from their respective emitter electrodes. These signals are supplied to the tuned-output-circuit amplifier 110, being applied to the base electrodes of its transistors 111 and 112 connected in emitter-coupled differential amplifier configuration.

The collector electrodes of transistors 111, 112 supply anti-phase amplified modulated carrier wave currents to a balanced anti-resonant tank load 115, which anti-resonant tank 115 acts as a band-pass filter and will reduce the amplitude of modulation sidebands remote from the video intermediate-frequency carrier wave. The particular video detector shown in FIG. 2 when employed in its operating environment in a television receiver will exhibit signal swings of up to three volts peak-to-peak between the collector electrodes of transistors 111, 112.

The automatic gain circuitry controlling the radio-frequency and intermediate-frequency amplifier gains of the television receiver will maintain the maximum excursions of modulated carrier waves applied to the terminals 101, 102 small enough to avoid signal limiting in the differential amplifier 110. This is done because limiting in the differential amplifier 110 is accompanied by unacceptably pronounced AM to PM conversion. The amplitude of the modulated carrier wave between the collector electrodes of transistors 111, 112 will be 3 volts peak-to-peak only for substantially black portions of the video signals encoded therein and will be smaller for brighter portions of the video signals encoded therein. It is these variations which must be removed in the subsequent limiter 120 to provide a substantially unmodulated carrier wave for application to the product detectors 130, 140.

The balanced tank circuit 115 is isolated from loading effects of the signal limiter 120 by transistors 116, 117 connected in emitter-follower configuration. This is done to avoid AM to PM conversion associated with variable loading of the tank circuit 115 during the carrier wave cycle, which would be caused by coupling the limiter diodes directly thereto.

The network coupled between terminals A, A′ and comprising resistor 121 and diodes 122, 123 limits the peak amplitude of the exalted carrier potentials applied to the product detectors 130, 140. Preferably the diodes 122, 123 are Schottky barrier diodes having a forward conduction threshold potential of 0.2 volt, approximately. Sufficient limiting of the carrier wave swings is then provided to maintain one of the silicon transistors of each product detector (131 or 132 of 130, 141 or 142 of 140) partially conducting throughout the detection cycle to provide continually a discharge path for charge stored in stray emitter capacitances 133, 143.

However, there is no attempt to restrain upward carrier potential swings at the emitter electrodes of the transistors 131, 132, 141, 142 as referred to ground reference potential. Such restraints are customarily imposed in the type of product detectors shown to avoid AM to PM conversion effects caused by the charging and discharging of the stray capacitances 133, 143 in response to carrier wave signals applied to the base electrodes of transistors 131, 132, 141, 142.

Rather, the concerted action of elements 121–127 is such as to compensate and to cancel the undesired AM to PM conversion effects upon linear video detector introduced by the still-remaining charging up of stray capacitances 133, 143 at the emitter electrodes of transistors 131, 132, 141, 142. The manner in which this compensation is effected does not appear susceptible of easy analysis, but the determination of the structure required to achieve this compensation is an aspect of the present invention.

Transistors 124, 125 in the circuit of FIG. 2 provide emitter-follower action primarily during more positive portions of the exalted carrier signals respectively applied to their base electrodes. During larger negative excursions of exalted carrier signal as applied to the base electrode of one of them, the potential at its emitter electrode is swung positive by the coupling through the forward biased one of the diodes 122, 123 to the emitter electrode of the other. The resistance of the resistors 126, 127 is chosen high enough to permit these positive potential swings to reverse bias the base-emitter semiconductor junction of each of the transistors 124, 125 for a portion of the cycle of the exalted carrier wave, which portion approaches a half cycle as the excursions of the exalted carrier wave potentials increasingly exceed a threshold value. The resultant potential waveforms at the emitter electrodes of transistors 124, 125 for relatively large-excursion exalted carrier potentials appear in FIG. 2 as W and W′. The emitter-follower action of transistor 124 or 125 produces a rectified peak during positive excursions of exalted carrier potential applied to its base electrode. The corresponding emitter-follower action of the other transistor coupled through the inverse-parallel combination of diodes 122, 124 produces a slightly smaller peak of the same polarity during the next half cycle of exalted carrier wave.

The difference potential between the waveforms W and W′ is substantially a square wave potential. This difference potential appears between the terminals A and A′ and provides exalted carrier switching signals to the product detectors 130, 140. For exalted carrier signals with excursions less than threshold value transistors 124, 125 will remain emitter-followers throughout the exalted carrier cycle.

The limiting action provided by the inverse-parallel diodes 122, 123 for large-excursion carrier wave signals is conceptually similar to that of the simpler signal limiter shown in FIG. 1. On each half cycle of exalted carrier wave the emitter-follower action of one of the transistors 124, 125 provides exalted carrier to be limited, from a low source impedance closely coupled to the inverse-parallel diodes 122, 123. This low source impedance is of the same order as the impedance of the forward biased one of the limiter diodes 122, 123. Thus, good limiter bandwidth is obtained even though the current flow through the conducting diode 122, 123 is only a fraction of a milliampere, as determined by the resistance of the emitter resistor (126 or 127) of the other, non-conductive one of the common-collector transistors 124, 125. On the next half cycle of exalted carrier wave a similar condition is provided with elements 122, 124 and 126 exchanging functional roles with their counterparts 123, 125 and 127.

This push-pull operation of the common-collector transistors alternating in providing a low impedance source of signals through emitter-follower action to the limiter diodes permits charging and discharging of the limiter capacitances using NPN transistors alone. This is important in conventional monolithic integrated circuitry, since while NPN transistors have good high frequency response, complementary PNP transistors do not. Also, there is no need for overall negative feedback schemes to obtain low source impedance with their inherent tendency toward undesirable regenerative effects.

Figure 3:
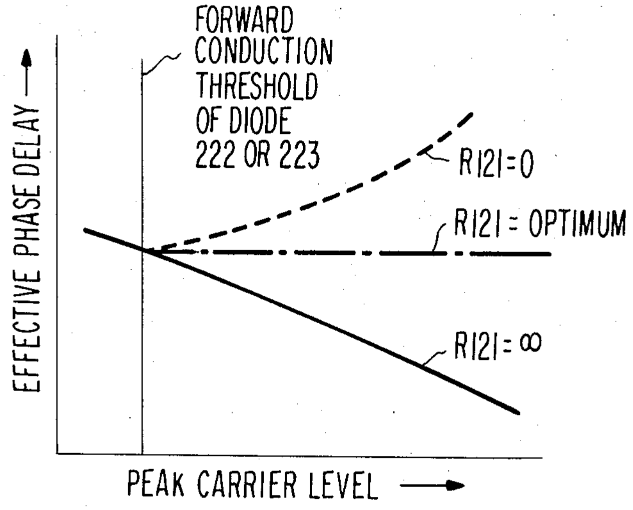
FIG. 3 is a graphical representation of the effects of component selection in the circuit of FIG. 2 upon the reduction of AM to PM conversion effects, an aspect of the present invention.

The resistance of the forward biased diode 122 or 123 affects the aforementioned compensation for the effects of charging up of capacitances in product detectors 130, 140; and this resistance may be augmented as shown in FIG. 2 with a bilaterally conductive resistance 121 to improve the compensation. FIG. 3 illustrates the effect of varying the augmenting resistance in the circuit of FIG. 2.

When the augmenting resistance such as provided by resistor 121 is zero, there is an increase in the effective phase delay of the exalted carrier which increases with exalted carrier level once the peak value of that level exceeds the conduction threshold for a forward biased diode. In the case where the augmenting resistance is infinite—that is where the inverse-parallel combination of diodes is in effect not in the circuit—the effective phase delay of the exalted carrier decreases with increasing carrier level.

If the augmenting resistance 121 is chosen to be 51 ohms in the circuit shown in FIG. 2, an intermediate condition can be found in which the effective phase delay of exalted carrier will remain substantially constant as the peak carrier level increases beyond the forward conduction threshold of the diodes 122, 123. Apparent incidental phase modulation for a fully modulated strong signal can be constrained to be less than 5° or 6° at the output of a subsequent video amplifier (not shown). The augmenting resistance 121 can be chosen to compensate for incidental phase distortion in the subsequent video amplifier.

The augmenting resistance required to obtain a substantially constant effective phase delay is smaller for the condition where the common-collector amplifier transistors 124, 125 are biased for partial-cycle emitter-follower action rather than for complete-cycle emitter-follower action. This helps maintain limiter bandwidth.

FIG. 4 shows alternative means for augmenting the forward resistance of inverse-parallel diodes in a network to be connected to terminals A, A′ instead of that including elements 121, 122, 123.

What is claimed is:

1. A signal limiter comprising:

a source of first and second input signals in anti-phase relationship to each other;

first and second transistors each having base and emitter electrodes with a semiconductor junction therebetween, each having a collector electrode and each being connected in a common-collector configuration, said base electrodes of said first and said second transistors connected to said source to receive respectively said first and said second input signals;

a differential amplifier having first and second input terminals respectively coupled to separate ones of said first and said second transistor emitter electrodes, and having an output circuit providing differential response to signals applied to its said input terminals;

first and second diodes each coupled between said first and said second differential amplifier input terminals and arranged in inverse-parallel relationship to each other; and means for causing emitter current flow through each of said emitter electrodes of said first transistor and said second transistor substantially sufficient to maintain forward conduction of their respective said semiconductor junctions during a portion of the cycle of said first and said second input signals, respectively, when said input signals are large enough that signals appearing between said first and said second differential amplifier input terminals are limited.

2. Signal limiter as claimed in claim 1 wherein:

third and fourth transistors, each having base and emitter electrodes with a base-emitter semiconductor junction therebetween and a collector electrode, are connected in coupled-emitter amplifier configuration to form said differential amplifier, said first and said second terminals of said differential amplifier respectively coupled to separate ones of said third and said fourth transistor base electrodes, said output circuit of said differential amplifier including the collector-to-emitter path of at least one of said third and said fourth transistors.

3. Signal limiter as claimed in claim 2 wherein:

said first and said second diodes are semiconductive junctions of a type with lower characteristic offset voltage during forward bias than said base-emitter semiconductor junctions of said third and said fourth transistors.

4. Signal limiter as claimed in claim 2 wherein:

a bilaterally conductive resistance is inserted in series connection with each of said first and said second diodes.

5. An exalted carrier amplitude modulation detector comprising:

a source of first and second modulated carrier wave currents;

a balanced anti-resonant tank circuit responsive to said first modulated carrier wave current to provide anti-phased first and second selectively filtered exalted carrier wave potentials;

first and second common-collector transistor amplifiers each having an input terminal direct-coupled to said balanced tank circuit to receive said first and said second selectively filtered exalted carrier wave potentials, respectively, and each having an output terminal;

utilization means for detected signals;

first and second transistors each having emitter and base electrodes with an emitter-base semiconductor junction therebetween and a collector electrode; said first and said second transistors being arranged as a product detector, said emitter electrodes of said first and said second transistor interconnected and arranged to receive said second modulated carrier wave current from said source, said base electrodes of said first and said second transistors respectively coupled to separate said output terminals of said common-collector transistor amplifiers, at least one of said collector electrodes of said first and said second transistors being coupled to said utilization means; and first and second diodes connected in anti-parallel combination between respective said output terminals of said first and of said second common-collector transistor amplifiers.

6. An exalted carrier amplitude modulation detector as defined in claim 5 wherein:

said first and said second diodes have a characteristic offset potential during forward bias lower than that of said emitter-base junctions of said first and said second transistors and first and second bilaterally conductive resistances are respectively connected in series with separate ones of said first and said second diodes within said anti-parallel combination.

7. An exalted carrier amplitude modulation detector as defined in claim 5 wherein:

said first and said second diodes have a characteristic offset potential during forward bias lower than that of said emitter-base junctions of said first and said second transistors and a bilaterally conductive resistance is serially coupled with both said first and said second diodes.

8. A signal limiter to provide symmetrically limited signals in response to input signals and for subsequent coupling to utilization means comprising:

a differential amplifier having first and second input terminals and an output circuit to supply said utilization means, said output circuit responding differentially to signals applied to said first and second input terminals;

first and second semiconductor diodes each having anode and cathode electrodes and each having stray capacitance associated therewith effectively between at least one of its said electrodes and a point of reference potential;

resistive means coupled between said second input terminal and said point of reference potential, said resistive means having a stray capacitance with respect to said point of reference potential and having a resistance relatively large as compared to the impedance of at least one of said stray capacitances at operating frequencies of said limiter;

means for coupling said first diode anode and said second diode cathode to said first input terminal;

means for coupling said first diode cathode and said second diode anode to said second input terminal, each of said coupling means having an impedance relatively small as compared to the impedance of at least one of said stray capacitances at said operating frequencies;

a source of input signals referred to said point of reference potential, coupled to said first input terminal and having a source impedance substantially smaller than the impedances of said stray capacitances at said operating frequencies, whereby signal-shunting effects of said stray capacitances are ineffective to prevent signal limiting by said first and said second semiconductor diodes for said operating frequencies and whereby said resistive means rather than said source impedance determines resistive currents in said first and said second diodes responsive to said input signals.

* * * * *

UNITED STATES PATENT OFFICE

CERTIFICATE OF CORRECTION

Patent No. 3,796,963 Dated March 12, 1974

Inventor(s) Alvin Reuben Balaban

It is certified that error appears in the above-identified patent and that said Letters Patent are hereby corrected as shown below:

At column 4, line 49, "diodes 122,124" should read --diodes 122,123--.

Signed and sealed this 16th day of July 1974.

(SEAL)
Attest:

McCOY M. GIBSON, JR.
Attesting Officer

C. MARSHALL DANN
Commissioner of Patents